(12) United States Patent
Stefanov et al.

(10) Patent No.: US 7,064,356 B2
(45) Date of Patent: Jun. 20, 2006

(54) FLIP CHIP LIGHT EMITTING DIODE WITH MICROMESAS AND A CONDUCTIVE MESH

(75) Inventors: Emil P. Stefanov, Altbach (DE); Hari S. Venugopalan, Somerset, NJ (US); Bryan S. Shelton, Bound Brook, NJ (US); Ivan Eliashevich, Maplewood, NJ (US)

(73) Assignee: GELcore, LLC, Valley View, OH (US)

( * ) Notice: Subject to any disclaimer, the term of this patent is extended or adjusted under 35 U.S.C. 154(b) by 155 days.

(21) Appl. No.: 10/826,980

(22) Filed: Apr. 16, 2004

(65) Prior Publication Data

US 2005/0230700 A1    Oct. 20, 2005

(51) Int. Cl.
*H01L 33/00*    (2006.01)

(52) U.S. Cl. .................... 257/99; 257/81; 257/91; 257/95

(58) Field of Classification Search .............. None
See application file for complete search history.

(56) References Cited

U.S. PATENT DOCUMENTS

| | | | |
|---|---|---|---|
| 3,954,534 A | 5/1976 | Scifres et al. | |
| 5,087,949 A | 2/1992 | Haitz | |
| 5,779,924 A | 7/1998 | Krames et al. | |
| 5,793,062 A | 8/1998 | Kish, Jr. et al. | |
| 6,274,293 B1 * | 8/2001 | Gupta et al. | 430/315 |
| 6,287,947 B1 | 9/2001 | Ludowise et al. | |
| 6,410,942 B1 | 6/2002 | Thibeault et al. | |

FOREIGN PATENT DOCUMENTS

| | | |
|---|---|---|
| DE | 4218806 A1 | 9/1993 |
| WO | WO 01/41219 | 6/2001 |
| WO | WO 01/41225 | 6/2001 |
| WO | WO 01/69692 | 9/2001 |
| WO | WO 01/97295 | 12/2001 |
| WO | WO 02/05358 | 1/2002 |
| WO | WO 02/07231 | 1/2002 |
| WO | WO 02/07232 | 1/2002 |
| WO | WO 02/13281 | 2/2002 |
| WO | WO 02/41410 | 5/2002 |
| WO | WO 02/056113 | 7/2002 |
| WO | WO 02/061847 | 8/2002 |

* cited by examiner

*Primary Examiner*—Tu-Tu Ho
(74) *Attorney, Agent, or Firm*—Fay, Sharpe, Fagan, Minnich & McKee, LLP

(57) ABSTRACT

A flip chip light emitting diode (12) includes a light-transmissive substrate (10) with a base semiconducting layer (40) disposed thereupon. A conductive mesh (18) is disposed on the base semiconducting layer (40) and is in electrically conductive contact therewith. Light-emitting micromesas (30) are disposed in openings (20) of the conductive mesh (18). Each light emitting micromesa (30) has a topmost layer (46) of a second conductivity type that is opposite the first conductivity type. A first conductivity type electrode (14) is disposed on the base semiconducting layer (40) and is in electrical communication with the electrically conductive mesh (18). An insulating layer (60) is disposed over the electrically conductive mesh (18). A second conductivity type electrode layer (24) is disposed over the insulating layer (60) and the light-emitting micromesas (30). the insulating layer (60) insulates the second conductivity type electrode layer (24) from the electrically conductive mesh (18).

23 Claims, 6 Drawing Sheets

Section S-S

Section S-S  FIG 4

FLIP CHIP LIGHT EMITTING DIODE WITH MICROMESAS AND A CONDUCTIVE MESH

BACKGROUND

The present invention relates to the lighting arts. It is especially related to gallium nitride-based high power flip chip light emitting diodes for lighting applications, and will be described with particular reference thereto. However, the invention will also find application in conjunction with other light emitting diode applications, other types of light emitting diodes, and other types of semiconductor light emitters such as vertical cavity surface emitting lasers.

Light emitting diodes are increasingly being employed in outdoor displays and signals, indoor illumination, and other applications that call for high levels of light output. Many of these applications employ gallium nitride-based light emitting diodes that emit light in the blue to near ultraviolet range. For lighting applications, a suitable phosphor is typically applied as a die coating or is integrated into a die-sealing encapsulant to convert the blue or ultraviolet light emitting diode output to a white or other selected light. The power output of such light emitting diodes is determined by a number of factors, including: light extraction from the semiconductor die; lateral current uniformity across the die; and the effectiveness of die heat sinking.

In a flip chip arrangement, active light-generating layers are deposited on a light-transmissive substrate wafer, and frontside electrodes are formed on the light generating layers. The substrate wafer is diced, and each die is bonded to contact pads of a sub-mount, printed circuit board or other support in flipped orientation, that is, with the light generating layers proximate to the support and the substrate distal from the support. In the flip chip arrangement, light is extracted through the light-transmissive substrate. However, problems can arise in that wave guiding in the light-generating layers tends to trap light and reduce the light extraction efficiency. Moreover, uniformity of lateral current spreading across the active device area suffers because the n-type and p-type electrodes are non-overlapping. Heat sinking is also limited and asymmetric between the p-type and n-type electrodes.

The present invention contemplates an improved apparatus and method that overcomes the above-mentioned limitations and others.

BRIEF SUMMARY

According to one aspect, a flip chip light emitting diode is disclosed, including a light-transmissive substrate. A base semiconducting layer of a first conductivity type is disposed on the light-transmissive substrate. A conductive mesh is disposed on the base semiconducting layer and is in electrically conductive contact therewith. Light-emitting micromesas are disposed in openings of the conductive mesh. Each light emitting micromesa has a topmost layer of a second conductivity type that is opposite the first conductivity type. A first conductivity type electrode is disposed on the base semiconducting layer and is in electrical communication with the electrically conductive mesh. An insulating layer is disposed over the electrically conductive mesh. A second conductivity type electrode layer is disposed over the insulating layer and the light-emitting micromesas. the insulating layer insulates the second conductivity type electrode layer from the electrically conductive mesh.

According to another aspect, a flip chip light emitting diode is disclosed, including a light-transmissive substrate. A base semiconducting layer of a first conductivity type is disposed on the light-transmissive substrate. Light-emitting micromesas are disposed on the base semiconducting layer. A first conductivity type electrode is disposed on the base semiconducting layer. The first conductivity type electrode includes a bonding pad region and at least one conductive finger extending from the bonding pad region to effect electrical communication between the first conductivity type electrode and the light-emitting micromesas. An insulating layer is disposed over the base semiconducting layer and the at least one conductive finger of the first conductivity type electrode. The insulating layer has openings to expose the bonding pad region of the first conductivity type electrode and topmost portions of the micromesas. A second conductivity type electrode layer is disposed over the insulating layer and the light-emitting micromesas. The insulating layer insulates the second conductivity type electrode layer from the at least one conductive finger of the first conductivity type electrode and the base semiconducting layer.

According to yet another aspect, a flip chip light emitting diode is disclosed, including a light transmissive substrate. A base semiconducting layer is disposed on the light transmissive substrate. Light emissive micromesas are arranged on the base semiconducting layer. the light emissive micromesas define an active area of the light emitting diode. A continuous electrode layer is disposed over the active area and contacts the tops of the micromesas. The continuous electrode layer is substantially co-extensive with the active area of the light emitting diode. An electrically conductive mesh is deposited on the base semiconducting layer in trenches between the micromesas. The electrically conductive mesh defines a continuous electrode that is substantially co-extensive with the active area of the light emitting diode. A discrete electrode is disposed outside of the active area of the light emitting diode. The discrete electrode electrically communicates with the conductive mesh.

Numerous advantages and benefits of the present invention will become apparent to those of ordinary skill in the art upon reading and understanding the following detailed description.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention. In the FIGURES, layer thicknesses and device lateral dimensions are not drawn to scale.

DETAILED DESCRIPTION OF THE PREFERRED EMBODIMENTS

Figure 1:
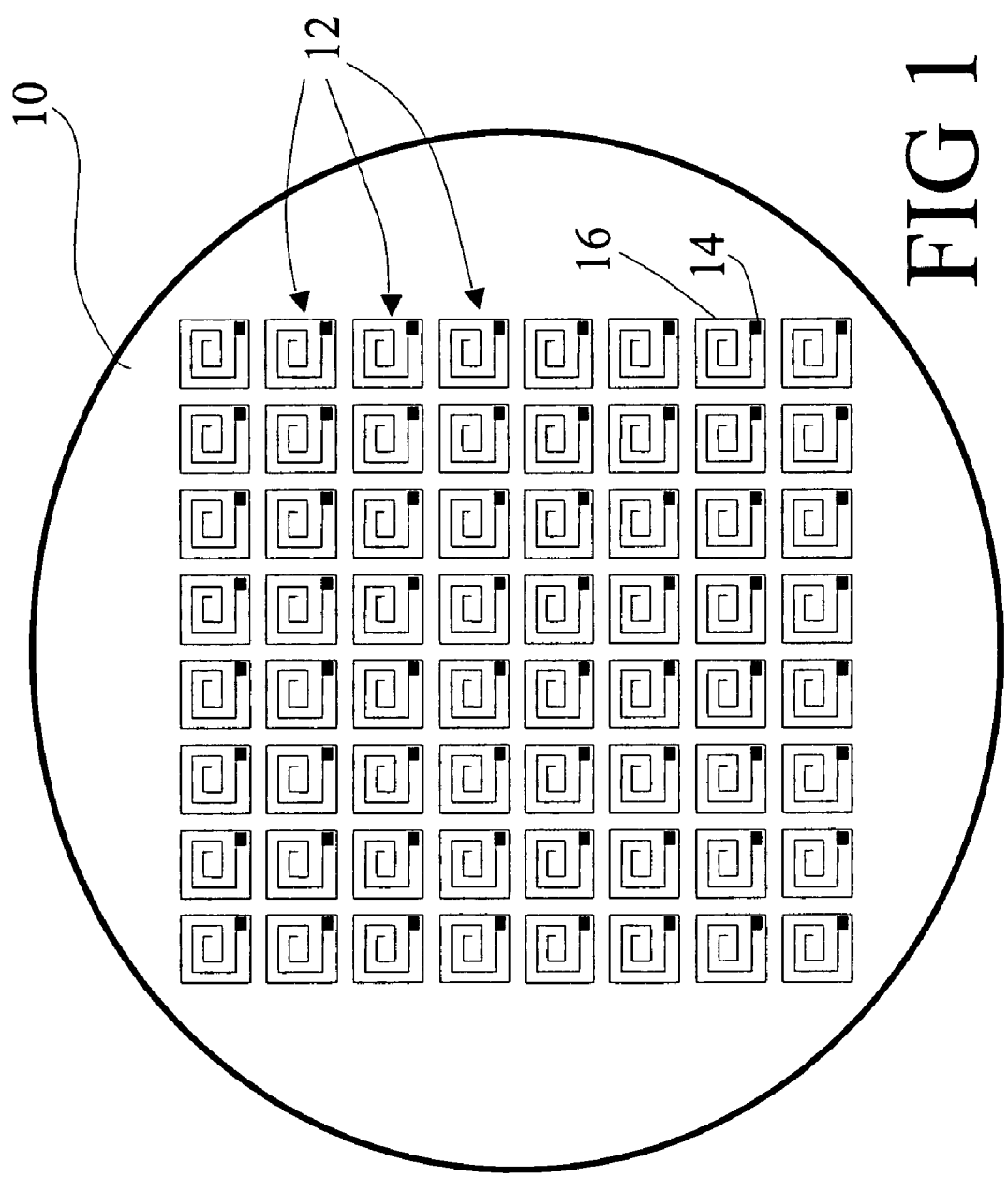
FIG. 1 shows a top view of a fabrication wafer with light emitting diode devices formed thereon, before dicing of the wafer. In depicting the light emitting diode devices in FIG. 1, the p-type electrode is omitted to show the spiral electrode fingers.

With reference to FIG. 1, a fabrication wafer 10 has disposed thereon a plurality of light emitting diode dice 12. The fabrication wafer 10 is silicon carbide (SiC), sapphire ($Al_2O_3$), gallium phosphide (GaP), gallium nitride (GaN), or another crystalline substrate suitable for depositing group III-nitride epitaxial semiconductor layers. The light emitting diode dice 12 are preferably fabricated on the fabrication wafer 10, followed by dicing of the wafer 10 to produce separated LED dice.

Figure 2:
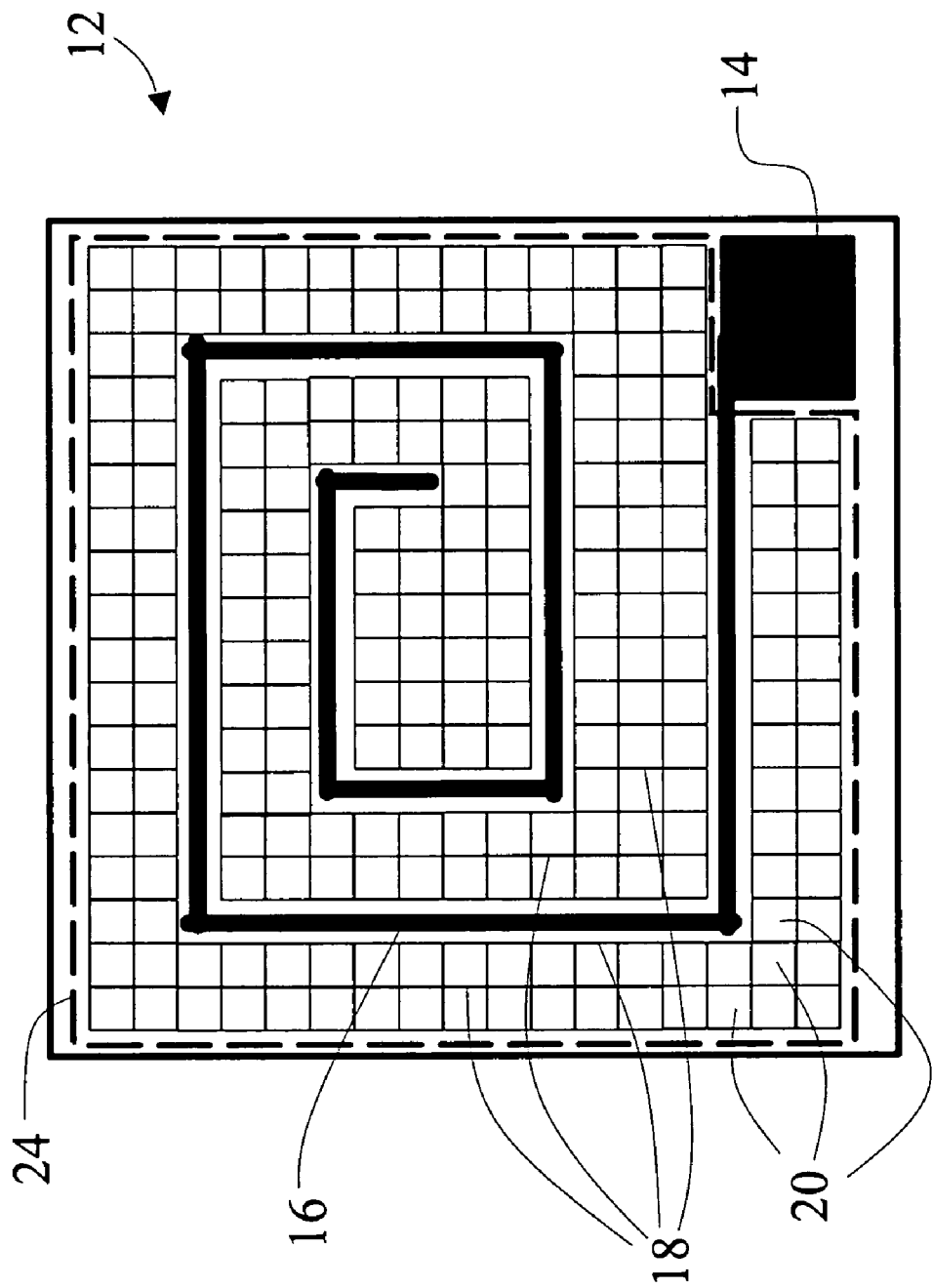
FIG. 2 shows a top view of one of the light emitting diode die after dicing of the fabrication wafer of FIG. 1. Again, depiction of the p-type electrode is omitted in FIG. 2 to show underlying features, and the extent of the p-type electrode is indicated by dashed lines.

With reference to FIG. 2, one such separated light emitting diode die 12 is shown, which includes an n-type electrode 14 electrically connected with a spiral electrode finger 16. The spiral electrode finger 16 provides distribution of electrical current across a lateral area of the light emitting diode die 12. In FIG. 2, the electrode finger 16 is shown as having a substantially uniform width with increasing distance along the finger from the n-type electrode 14. However, the electrode finger optionally has a narrowing or tapering width with increasing distance along the finger from the n-type electrode. Such optional tapering accounts for a decrease in electrical current magnitude with increasing distance along the finger from the n-type electrode 14 during device operation. Tapering is commonly used in electrode fingers of solar cells for this purpose. Moreover, the electrode finger can have other configurations besides a spiral, or multiple electrode fingers can extend from the n-type electrode 14. The specific configuration of the electrode finger or fingers is selected to efficiently distribute electrical current across the lateral area of the light emitting diode die 12.

To further promote uniform electrical current spreading, a conductive mesh 18 of deposited patterned metal or another conductive material defines mesh openings 20. In the illustrated embodiment, the conductive mesh 18 has a rectangular grid configuration with rectangular cells defining square mesh openings 20. However, the conductive mesh 18 can have circular- or otherwise-shaped cells, and can define otherwise-shaped openings. Moreover, rather than a rectangular symmetry, the conductive mesh can have a hexagonal or other symmetry, or can be aperiodic. A p-type electrode 24 is distributed across the light emitting diode 12 in generally continuous fashion, excepting that the p-type electrode 24 does not laterally overlap the n-type electrode 14. (The p-type electrode 24 is omitted in FIGS. 1–3 to show underlying features. In FIG. 2 the lateral extent of the p-type electrode 24 is indicated by dashed lines).

Figure 3:
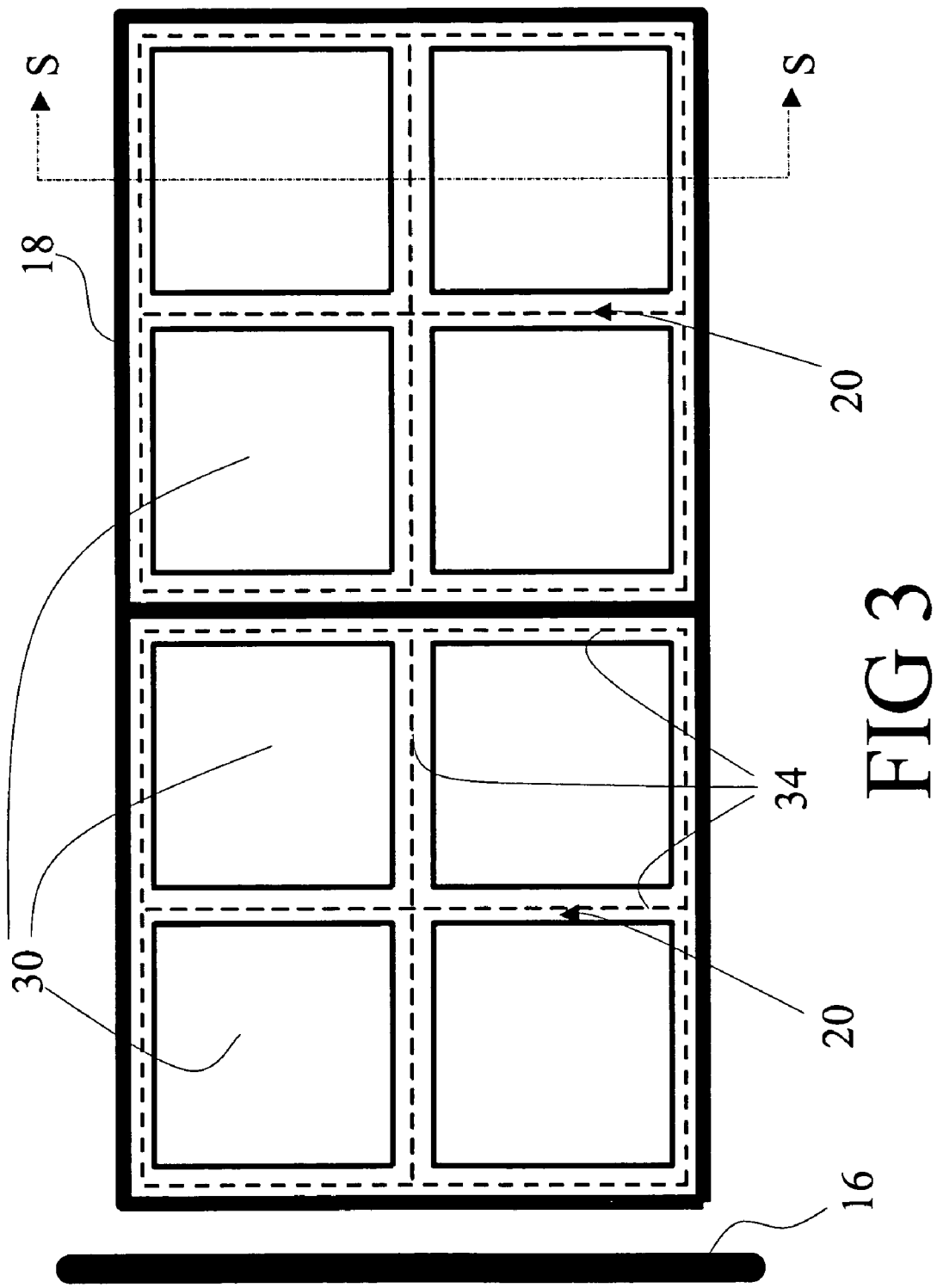
FIG. 3 shows a top view of two openings defined by the conductive mesh of the light emitting diode die of FIG. 2, along with micromesas disposed in the mesh openings. Again, the p-type electrode is not depicted in FIG. 3 so as to show underlying features.
Figure 4:
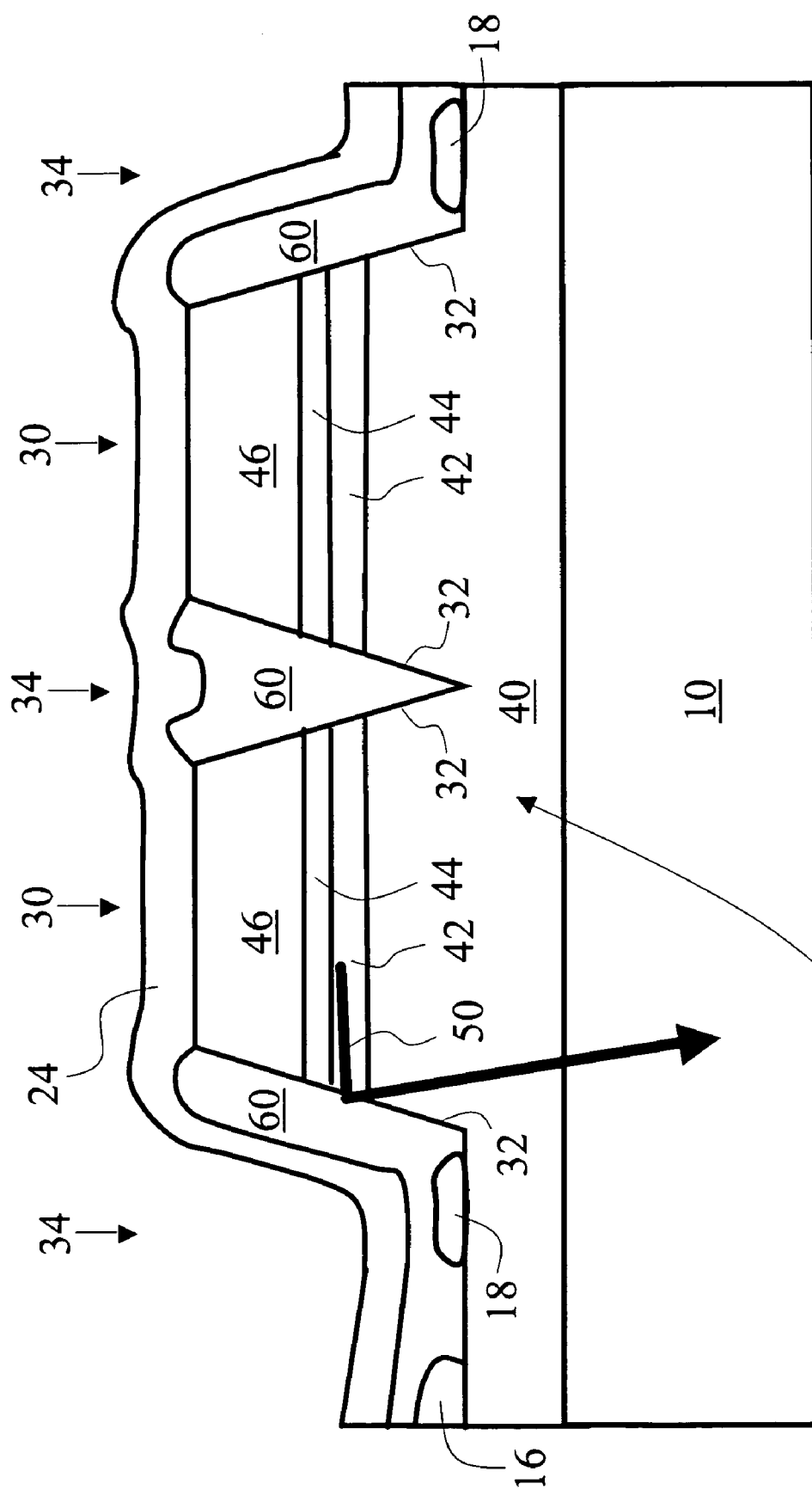
FIG. 4 shows the cross-section S—S indicated in FIG. 3.

With reference to FIGS. 3 and 4, each mesh opening 20 has four micromesas 30 disposed therein. In other words, the micromesas 30 are laterally surrounded by the conductive mesh 18. The micromesas 30 are distributed across an active device area of the light emitting diode die 12. In other words, the distribution of the micromesas 30 effectively defines the active area of the light emitting diode die 12. The conductive mesh 18 can be viewed as a continuous n-type electrode disposed over the active area of the light emitting diode die 12 and substantially co-extensive with the active area. The continuous electrode defined by the conductive mesh 18 is in electrical communication with the discrete n-type electrode 14. The discrete n-type electrode 14 is disposed outside of the active area. The p-type electrode 24 is also substantially co-extensive with the active area of the light emitting diode die 12.

As seen in the cross-section S—S shown in FIG. 4, each micromesa 30 has slanted sidewalls 32 that define trenches 34 surrounding the micromesas 30. Although four micromesas 30 are enclosed within each mesh opening 20 in the illustrated embodiment, more or fewer micromesas can be enclosed within each conductive mesh opening. Indeed, as few as a single micromesa per mesh opening can be enclosed. The deposited metal or other conductive material defining the conductive mesh 18 is disposed in at least some of the trenches 34.

With particular reference to FIG. 4, which shows a cross-section of two micromesas 30 and the surrounding conductive mesh 18, in a preferred embodiment a base semiconducting layer 40 is deposited on the substrate 10. For a p-on-n diode configuration, the base semiconducting layer 40 is doped n-type, and in a preferred group III-nitride embodiment is preferably gallium nitride (GaN). An active layer 42, which is preferably an indium gallium nitride ($In_xGa_{1-x}N$) alloy layer (where x is the molar fraction of indium nitride (InN)), is disposed on the base semiconducting layer 40. A p-type region is disposed on the active layer 42. In the illustrated embodiment the p-type region includes an aluminum gallium nitride ($Al_yGa_{1-y}N$) alloy layer 44 (where y is the molar fraction of aluminum nitride (AlN)) on top of which is deposited a topmost p-type gallium nitride (GaN) layer 46.

The semiconductor layers 40, 42, 44, 46 are preferably deposited on the fabrication substrate wafer 10 by metalorganic chemical vapor deposition (MOCVD; also known in the art as organometallic vapor phase epitaxy, OMVPE, and other similar nomenclatures), by molecular beam epitaxy (MBE), chemical beam epitaxy (CBE), or another epitaxial deposition technique.

The semiconductor layers 40, 42, 44, 46 define an exemplary light emitting diode device structure. Those skilled in the art can readily modify the exemplary diode structure to suit specific applications. For example, the base semiconducting layer 40 is shown in FIG. 4 as being deposited directly onto the substrate 10. However, optionally an epitaxy-promoting layer of aluminum nitride (AlN) or another material is deposited first to improve the subsequent epitaxy. An n-on-p structure can be substituted for the illustrated p-on-n device structure. The active layer can include multiple quantum wells, a superlattice, or another multiple-layer structure that promotes radiative recombination of electron-hole pairs. Moreover, the exemplary group III-nitride device structure can be replaced by a device structure of a group III-phosphide, group III-arsenide, or other material system, or by a combination of such material systems. For example, layers of lattice-matched compositions of group III-arsenide and group III-phosphide compounds can be combined in a diode structure.

After epitaxial deposition, the micromesas 30 are formed by mesa etching to define the slanted sidewalls 32 and the trenches 34. The mesa etching can employ dry etching such as plasma etching, reactive ion beam etching, or the like, wet etching, or the like. Preferably, the micromesas 30 are square-shaped with dimensions of about 3 microns to 20 microns on a side (corresponding to micromesa areas between about 9 square microns and about 400 square microns). However, other micromesa shapes and sizes can be used. The angle of the slanted sidewalls 32 is selected to optimize light extraction efficiency and active area. Larger slant angles (that is, sides that deviate significantly from vertical) promote higher light extraction efficiency in the finished flip-chip device, since the slanted sides act as mirrors that reflect laterally directed light 50 generally toward the transparent substrate 10. However, larger slant angles also reduce the micromesa-to-trench area ratio, which reduces active device area. The angle of the slanted sidewalls 32 is optimized for specific light emitting device applications based on these considerations.

With reference to FIG. 4, it will be observed that the mesa etching does not completely remove the base semiconducting layer 40. That is, at least a portion of the base semiconducting layer 40 remains in the area of the trenches 34, and so the base semiconducting layer 40 is continuous across the active device area. This lateral continuity of the base semiconducting layer 40 enhances current spreading amongst the micromesas 30.

The conductive mesh 18 is deposited and patterned on the base semiconducting layer 40 within selected trenches 34. In one suitable embodiment, a lift-off patterning is employed, in which resist is applied and patterned to expose areas where the mesh 18 is to be present. The conductive mesh metal is deposited by vacuum evaporation or another technique, and the metal coats both the exposed areas and the resist. The resist is then stripped using a suitable solvent to lift off the metal except in the exposed areas. In another approach, the mesh metal is deposited first, followed by resist deposition and patterning to expose the metal in areas other than where the mesh 18 is to be present. A suitable wet chemical etchant or dry etching is applied to remove the exposed metal, followed by stripping of the resist. In yet another suitable approach, a shadow mask is used to directly pattern the metal during deposition.

Preferably, the n-type electrode 14 and the electrode finger 16 are formed along with the conductive mesh 18. However, if the n-type electrode 14 and/or the electrode finger 16 have a greater thickness than the mesh 18, are made of a different metal, or are otherwise materially different from the mesh 18, then separate fabrication processes are suitably used for producing the conductive mesh 18, the electrode finger 16, and the n-type electrode 14.

After metal deposition, an insulator 60 is applied over at least the metal mesh 18, and preferably also over the electrode finger 16 and the sidewalls 32 of the micromesas 30. The insulating film 60 includes openings through which the topmost p-type layer 46 is at least partially exposed. The openings in the insulator film 60 are produced using lithography, shadow masking during insulator deposition, or another suitable patterning process. Deposition of the insulator 60 is followed by a blanket p-type contact metal deposition that forms the p-type electrode layer 24. The p-type electrode layer 24 contacts the exposed portion of the topmost p-type layer 46 of each micromesa 30 to make electrical contact therewith. However, the insulator 60 electrically isolates the p-type electrode layer 24 from the conductive mesh 18. Moreover, the deposition of the p-type electrode layer 24 is shadow masked or performed in conjunction with lithography to keep the p-type electrode layer 24 separate from the n-type electrode 14.

Preferably, the fabrication processes discussed above, up to and including deposition of the p-type electrode layer 24, are performed as wafer-level processes to define the processed wafer shown in FIG. 1. After deposition of the p-type electrode layer 24, the wafer is diced to separate each light emitting diode device die 12. The individual device die have exposed electrodes 14, 24 that are then flip-chip bonded to a sub-mount, printed circuit board, or other support that has bonding pads aligned with the electrodes 14, 24.

Figure 5:
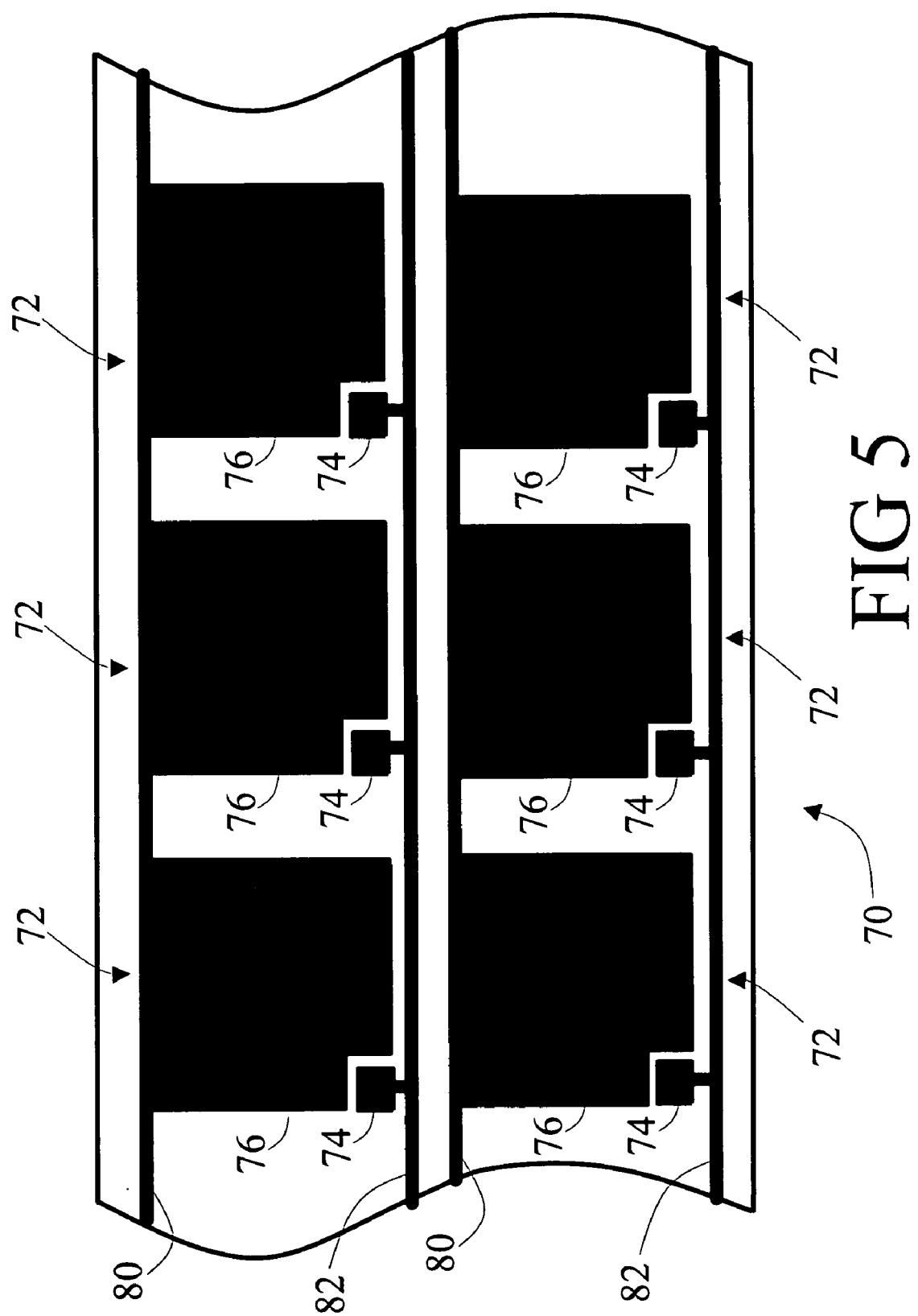
FIG. 5 shows an exemplary strip sub-mount onto which the light emitting diode dice such as the die shown in FIG. 2 are suitably flip chip bonded.

FIG. 5 shows a portion of an exemplary strip-type sub-mount 70. The illustrated portion includes six bonding pad sets 72 for bonding six light emitting diode dice 12. Each bonding pad set 72 includes an n-type bonding pad 74 that bonds with the n-type electrode 14, and a p-type bonding pad 76 that bonds with the p-type electrode 24. The exemplary strip sub-mount 70 has two positive electrical power buses 80 and two negative electrical power buses 82 that interconnect the bonding pad sets 72. The strip-type sub-mount 70 is exemplary only. Those skilled in the art can readily construct other sub-mounts, printed circuit board layouts, or the like for specific applications.

In operation, the electrodes 14, 24 receive electrical power from the bonding pads 74, 76. Current communicates with the topmost p-type layer 46 through the p-type electrode 24, which distributes current amongst the micromesas 30. Similarly, the micromesas 30 are in electrical communication with the n-type electrode 14 via the electrode finger 16 and the base semiconducting layer 40. The conductive mesh 18 provides further current spreading to distribute current amongst the micromesas 30. Electrical communication between the electrode finger 16 and the conductive mesh 18 is via the base semiconducting layer 40, since there is no direct electrical contact between the electrode finger 16 and the conductive mesh 18.

An additional benefit of the conductive mesh 18 and the electrode finger 16 is improved thermal heat sinking. If the conductive mesh 18 and the electrode finger 16 are made of thermally conductive materials, such as most metals, then they provide heat sinking paths that conduct heat generally toward the n-type electrode 14. These heat sinking paths are more efficient than conducting heat from the buried n-type layer 40 through the active layer 42 and the p-type region 44, 46 to the p-type electrode 24, and the improved heat removal from deeply buried layers of the epitaxial structure can reduce heating in the active region of the device.

Figure 6:
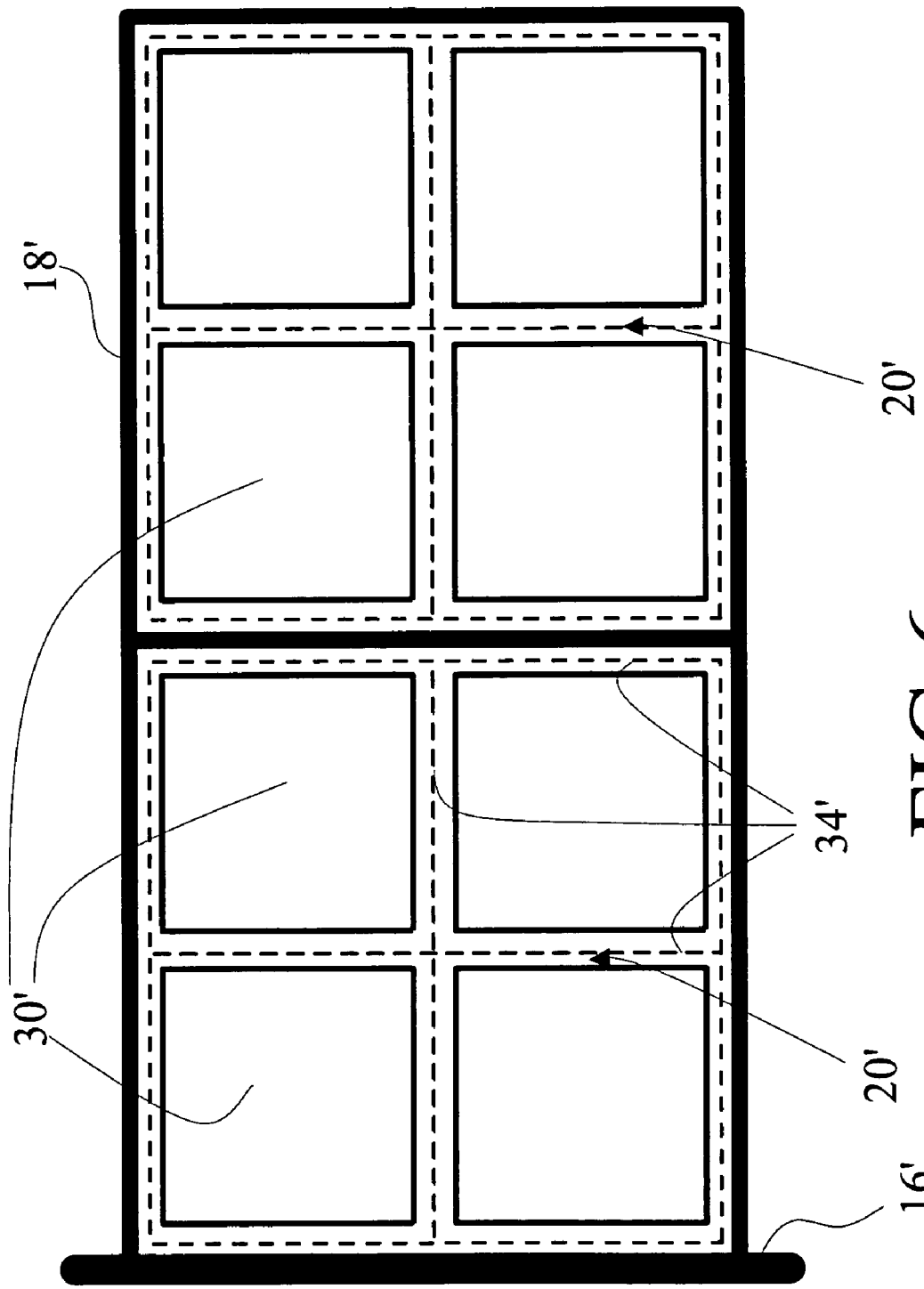
FIG. 6 shows, for an alternative embodiment, a top view of two openings defined by the conductive mesh of the light emitting diode die, along with micromesas disposed in the mesh openings In the alternate embodiment of FIG. 6, the electrode finger forms part of the conductive mesh.

With reference to FIG. 6, a variant embodiment is shown, which includes a conductive mesh 18' defining mesh openings 20', and micromesas 30' defined by trenches 34'. These features are substantially similar to corresponding features of the embodiment of FIGS. 1–4, and the correspondence is indicated by using corresponding primed reference numbers in FIG. 6. The embodiment of FIG. 6 differs from that of FIGS. 1–4 in that the electrode finger 16' is in direct electrical contact with the conductive mesh 18'. In other words, the electrode finger 16' forms part of the conductive mesh 18'. This is in contrast to the embodiment of FIGS. 1–4, in which electrical communication between the electrode finger 16 and the conductive mesh 18 is via the base semiconducting layer 40. The embodiment of FIG. 6 may be preferred in devices where the base semiconducting layer has relatively low conductivity. In such devices, direct electrical contact between the electrode finger 16' and the conductive mesh 18' can reduce series resistance of the device. On the other hand, for a relatively high conductivity base semiconducting layer, the indirect electrical communication between the electrode finger 16 and the conductive mesh 18 of the embodiment of FIGS. 1–4 can promote more uniform current spreading. For a sufficiently conductive base semiconducting layer, the conductive mesh 18 is optionally omitted and current spreading is accomplished through the electrode finger and the base semiconducting layer 40.

The described embodiments optionally incorporate a phosphor in various ways. In one approach, the light transmissive substrate 10 contains a phosphor doping. In another approach, a phosphor coating is applied to a side of the substrate 10 opposite from the side of the substrate on which the semiconducting layers 40, 42, 44, 46 are disposed. In yet another approach, an epoxy or other encapsulant is used to encapsulate the light emitting diode die 12 after flip chip bonding to the sub-mount 70, and the epoxy or other encapsulant contains a phosphor. Those skilled in the art can readily incorporate a phosphor or a plurality of phosphors using these or other similar approaches. Such a phosphor or phosphors can be used, for example, to convert blue or ultraviolet radiation produced by group III-nitride-based micromesas 30 into generally white light.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A flip chip light emitting diode including:
   a light-transmissive substrate;
   a base semiconducting layer of a first conductivity type disposed on the light-transmissive substrate;
   a conductive mesh disposed on the base semiconducting layer and in electrically conductive contact therewith;
   light-emitting micromesas disposed in openings of the conductive mesh, each light emitting micromesa having a topmost layer of a second conductivity type that is opposite the first conductivity type;
   a first conductivity type electrode disposed on the base semiconducting layer and in electrical communication with the electrically conductive mesh;
   an insulating layer disposed over the electrically conductive mesh; and
   a second conductivity type electrode layer disposed over the insulating layer and the light-emitting micromesas, the insulating layer insulating the second conductivity type electrode layer from the electrically conductive mesh.

2. The flip chip light emitting diode as set forth in claim 1, further including:
   at least one conductive finger disposed on the base semiconducting layer, the at least one conductive finger effecting the electrical communication between the first conductivity type electrode and the conductive mesh.

3. The flip chip light emitting diode as set forth in claim 2, wherein the at least one conductive finger contacts the first conductivity type electrode but does not contact the conductive mesh, the electrical communication being effected by electrical current flow between the at least one conductive finger and the conductive mesh passing through the base semiconducting layer.

4. The flip chip light emitting diode as set forth in claim 1, wherein the base semiconducting layer and the topmost layer are formed of group III-nitride materials.

5. The flip chip light emitting diode as set forth in claim 4, wherein the first conductivity type is n-type, and the second conductivity type is p-type.

6. The flip chip light emitting diode as set forth in claim 1, wherein the micromesas are square-shaped with dimensions of about three to twenty microns on a side.

7. The flip chip light emitting diode as set forth in claim 1, wherein the conductive mesh includes a rectangular grid.

8. The flip chip light emitting diode as set forth in claim 1, wherein at least two micromesas are disposed in each opening of the conductive mesh.

9. The flip chip light emitting diode as set forth in claim 1, wherein four micromesas are disposed in each opening of the conductive mesh.

10. The flip chip light emitting diode as set forth in claim 1, wherein micromesas each include:
    slanted sidewalls arranged to reflect laterally directed light generally toward the light-transmissive substrate.

11. A flip chip light emitting diode including:
    a light-transmissive substrate;
    a base semiconducting layer of a first conductivity type disposed on the light-transmissive substrate;
    light-emitting micromesas disposed on the base semiconducting layer;
    a first conductivity type electrode disposed on the base semiconducting layer, the first conductivity type electrode including a bonding pad region and at least one conductive finger extending from the bonding pad region to effect electrical communication between the first conductivity type electrode and the light-emitting micromesas;
    an insulating layer disposed over the base semiconducting layer and the at least one conductive finger of the first conductivity type electrode, the insulating layer having openings to expose the bonding pad region of the first conductivity type electrode and topmost portions of the micromesas; and
    a second conductivity type electrode layer disposed over the insulating layer and the light-emitting micromesas, the insulating layer insulating the second conductivity type electrode layer from the at least one conductive finger of the first conductivity type electrode and the base semiconducting layer.

12. The flip chip light emitting diode as set forth in claim 11, wherein the micromesas have non-vertical sidewalls inclined at an angle selected to reflect light produced in the micromesas toward the light-transmissive substrate.

13. The flip chip light emitting diode as set forth in claim 11, wherein the micromesas have a lateral area between 9 square microns and 400 square microns.

14. The flip chip light emitting diode as set forth in claim 13, wherein the micromesas have a generally square lateral shape.

15. The flip chip light emitting diode as set forth in claim 11, wherein the micromesas electrically communicate with the at least one conductive finger of the first conductivity type electrode through the base semiconducting layer.

16. The flip chip light emitting diode as set forth in claim 11, further including:
    a conductive mesh disposed on the base semiconducting layer, the micromesas being arranged in mesh openings defined by the conductive mesh.

17. The flip chip light emitting diode as set forth in claim 16, wherein the conductive mesh electrically communicates with the at least one conductive finger through the base semiconducting layer.

18. The flip chip light emitting diode as set forth in claim 16, wherein the at least one conductive finger forms part of the conductive mesh.

19. The flip chip light emitting diode as set forth in claim 11, wherein each micromesa includes:
    a topmost layer of a second conductivity type, the second conductivity type being of an opposite conductivity from the first conductivity type, the second conductivity type electrode layer electrically contacting the topmost layer.

20. A flip chip light emitting diode including:
a light transmissive substrate;
a base semiconducting layer disposed on the light transmissive substrate;
light emissive micromesas arranged on the base semiconducting layer, the light emissive micromesas defining an active area of the light emitting diode;
a continuous electrode layer disposed over the active area and contacting the tops of the micromesas, the continuous electrode layer being substantially co-extensive with the active area of the light emitting diode;
an electrically conductive mesh deposited on the base semiconducting layer in trenches between the micromesas, the electrically conductive mesh defining a continuous electrode that is substantially co-extensive with the active area of the light emitting diode; and
a discrete electrode disposed outside of the active area of the light emitting diode, the discrete electrode electrically communicating with the conductive mesh.

21. The flip chip light emitting diode as set forth in claim 20, wherein the discrete electrode and the continuous electrode layer are adapted for flip chip bonding to an associated support.

22. The flip chip light emitting diode as set forth in claim 20, further including:
a conductive finger extending from the discrete electrode into the active area of the light emitting diode to effect electrical communication of the discrete electrode with the continuous electrode defined by the conductive mesh.

23. The flip chip light emitting diode as set forth in claim 20, further including:
an insulating film disposed between the continuous electrode layer and the continuous electrode defined by the conductive mesh, the continuous electrode layer and the continuous electrode defined by the conductive mesh being electrically isolated from one another by the insulating film.

* * * * *